PARAMETRIC UP-CONVERTER WITH D.C.-ISOLATED IRIS AS VARACTOR-HOLDER

Filed Feb. 24, 1965

SECTION II-II

INVENTOR
JOHANN M. OSTERWALDER
BY Curphey & Erickson
PATENT AGENTS

PARAMETRIC UP-CONVERTER WITH D.C.-ISOLATED IRIS AS VARACTOR-HOLDER

Filed Feb. 24, 1965 2 Sheets-Sheet 2

SECTION III - III

SECTION IV - IV

INVENTOR
JOHANN M. OSTERWALDER
BY Curphey & Erickson
PATENT AGENTS

United States Patent Office 3,287,568

Patented Nov. 22, 1966

3,287,568

PARAMETRIC UP-CONVERTER WITH D.C.-ISOLATED IRIS AS VARACTOR-HOLDER

Johann Osterwalder, Ottawa, Ontario, Canada, assignor to Northern Electric Company Limited, Montreal, Quebec, Canada Filed Feb. 24, 1965, Ser. No. 434,982

8 Claims. (Cl. 307—88.3)

This invention relates to a non-linear impedance device and more particularly to such a device which may be used as an up-converter, a down-converter or a negative resistance parametric amplifier.

In the past, various forms of microwave mixers and amplifiers have been developed. In many of these devices, a non-linear impedance diode is used as the active element. If the diode is of a variable-capacitance type, as opposed to a variable-resistance type, amplification of an input signal coupled to the device will result under favourable conditions. Such devices are known as parametric devices. If the output signal from the amplifier has the same frequency as the input signal, the device is generally known as a negative-resistance parametric amplifier. If the output signal is equal to the sum or difference of the input signal and a pump signal which is used to pump the diode, then the device is generally known as a upper-sideband up-converter or a lower-sideband up-converter respectively. In this case the output signal is often referred to as the idler signal.

One such parametric amplifier has been described by L. A. Harwood and T. Murakami in an article entitled "An Experimental Parametric Tuner for U.H.F. Television Receivers," RCA Review; volume XXIV, No. 2; June 1963, pages 253–281. On pages 269 and 270 of this journal, FIGURES 12, 13 and 14 disclose an up-converter comprising a waveguide having a pump cavity and an idler cavity disposed end to end. The cavities are separated from each other by a symmetrical inductive iris. A varactor diode is placed across the iris opening and is connected at one end to the waveguide and at the other end to a signal input circuit. One advantage of utilizing an iris at the junction of the idler and pump cavities, is that good isolation between the tuning elements can be obtained. This results in ease of tuning of the circuit components.

One disadvantage of such a device is that with a fixed inductive iris, the coupling to the diode at the idler frequency cannot be varied. With a fixed pump frequency this restricts the tuning range of the device since it is usually necessary to vary the idler coupling to the diode as the signal frequency is varied over a wide range.

A still more important disadvantage is that the varactor diode is parallel tuned as can be seen from the circuit diagram of FIGURE 14. If the diode is resonated in parallel, the impedance level required for the associated filter will be higher than if the same diode is resonated in series at the same frequency. This usually results in the use of variable capacitance diodes with larger capacitances which in general have lower Q's. It also may make the filter design more inconvenient. Another disadvantage is that the parasitic series inductance of the diode cannot be incorporated into the parallel resonator circuit. In addition, obtaining an $\alpha = C_1/C_0$ ratio which is as large as possible is vital if wide bandwidth is desired. If the diode is resonated in shunt, any stray shunt capacitances add directly to $C_0$ and decrease the size of the ratio $C_1/C_0$.

These disadvantages have been overcome in the present invention, while retaining the advantage of the prior art up-converter discussed above, by series tuning the varactor diode. The invention provides a waveguide having a capacitive iris located therein. Means are provided for coupling a first signal to one end of the waveguide and for coupling a second signal to or from the other end of the waveguide. The present invention includes a diode having one of its electrodes connected to the iris and the other electrode connected to a series tuning element. A third signal having a frequency below the cut-off frequency of the waveguide, is coupled to and/or from the iris through an input signal circuit. The third signal frequency is equal to the difference between the first and second signal frequencies. In addition, a means is provided for electrically isolating the iris from the waveguide at the third signal frequency. If the invention is being used as an up-converter or a down-converter, the diode may be of a non-linear resistance type. If the invention is being used as an up-converter or a parametric amplifier, the diode may be of a non-linear capacitance type.

The advantages of series tuning as opposed to parallel tuning of the varactor diode have been dealt with at length by George L. Matthaei in "A Study of the Optimum Design of Wide-band Parametric Amplifiers and Up-converters" IRE transactions on Microwave Theory and Techniques, January, 1961, pages 23–38; where on pages 24 and 25, the author gives a number of reasons for preferring series tuning.

In a preferred embodiment, the waveguide includes first and second waveguide cavities disposed end to end and separated from each other by the capacitive iris. The first and second signals are coupled to or from the cavities by any one of the well-known means which include iris coupling, loop coupling or capacitive probe coupling.

When a non-linear capacitance diode, or varactor diode as it is commonly known, is used, the invention is known as a parametric amplifier; and the first cavity is known as a pump cavity, and the second cavity as an idler cavity. The first, second and third signals are then known as pump, idler and input signals respectively. With this arrangement, the invention serves to increase the amplitude of the input signal if it is used as an up-converter or a non-degenerate parametric amplifier.

In a still more preferred embodiment, the waveguide is rectangular and the series tuning element is a coaxial tuning stub having its outer-conductor connected at one end to a broad wall of the waveguide and its inner-conductor connected at one end to the diode.

To isolate the iris from the waveguide at the input signal frequency, a pair of low-pass filters, having a cut-off frequency between the cut-off frequency of the waveguide and the input signal frequency, are employed. One low-pass filter is connected in series with the input signal circuit and forms part thereof while the other low-pass filter is connected to the iris and the waveguide and is left open-circuited at one end.

A preferred embodiment of the invention will now be described with reference to the accompanying drawings in which.

Figure 1:
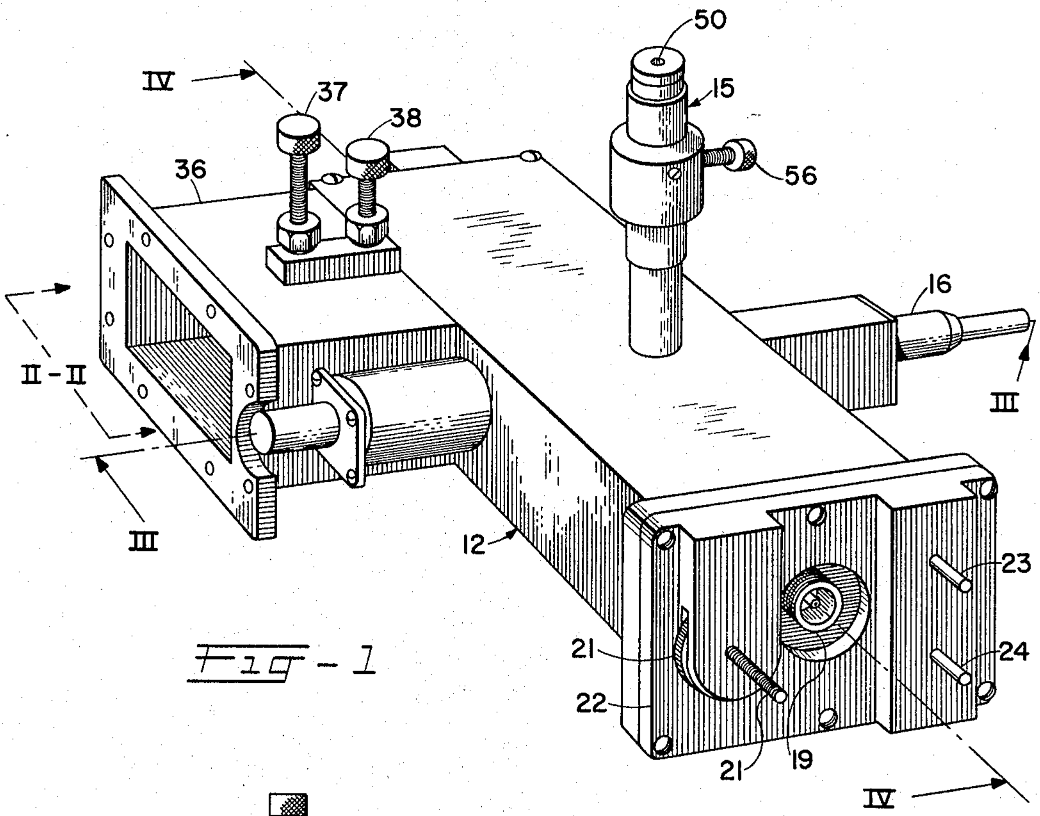
FIGURE 1 is a perspective view of a parametric amplifier in accordance with the present invention.
Figure 2:
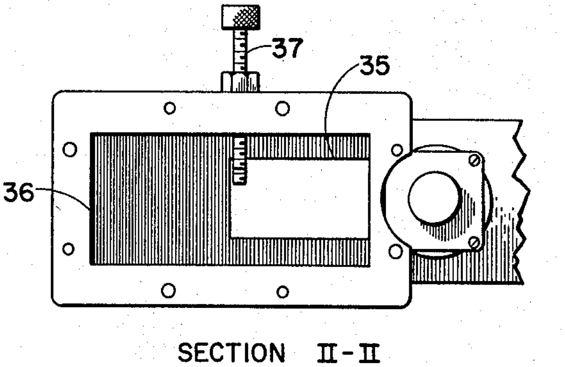
FIGURE 2 is a side elevational view of part of the amplifier, taken along the line II—II of FIGURE 1.
Figure 3:
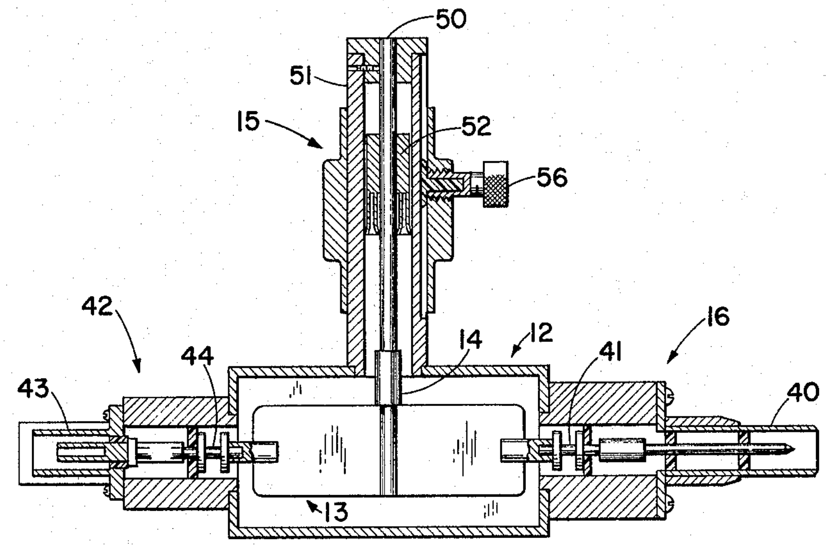
FIGURE 3 is a cross-sectional view of the amplifier, taken along the line III—III of FIGURE 1.
Figure 4:
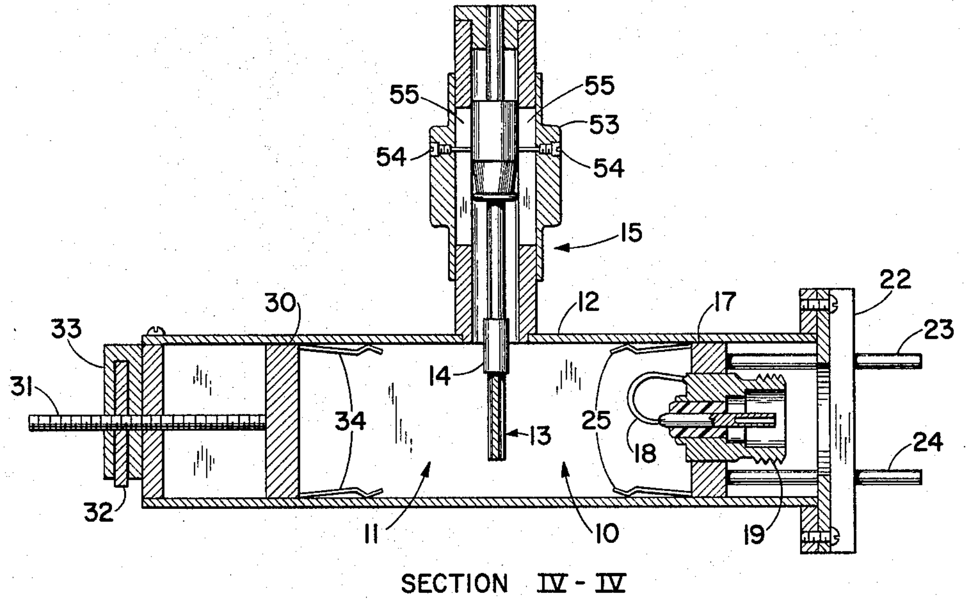
FIGURE 4 is a cross-sectional view of the amplifier, taken along the line IV—IV of FIGURE 1.

Referring to FIGURES 1, 2, 3 and 4, the parametric amplifier generally comprises a pump cavity 10 and an idler cavity 11 disposed end to end in a rectangular waveguide 12 and separated from each other by a capacitive iris 13. In addition, the up-converter comprises a varactor diode 14 connected at one end to the iris 13 and at the other end to a coaxial tuning stub 15. The up-converter also includes a coaxial signal arm 16 which is connected at one end to the capacitive iris 13.

The pump cavity 10 is formed by the walls of the waveguide 12, the iris 13 and an adjustable shorting plunger 17. A pump signal is coupled to the pump cavity 10 by an inductive coupling loop 18 which is connected to a coaxial input connector 19 located in the plunger 17. The coupling between the loop 18 and the cavity 10 may be varied by rotating the connector 19. To tune the cavity 10, the plunger 17 is moved axially along the waveguide by means of a threaded shaft 20 and an adjusting nut 21. The adjusting nut 21 is confined from moving axially by an end plate 22 which is connected by suitable means to the pump cavity end of the waveguide 12. Two guide rods 23 and 24 are provided to prevent jamming of the plunger 17. To minimize R.-F. leakage past the plunger 17, finger stock 25 is soldered to the plunger 17 so that it makes sliding contact with all four walls of the rectangular waveguide 12.

The idler cavity 11 is formed by the walls of the waveguide 12, the iris 13 and an adjustable shorting plunger 30. The idler cavity 11 is tuned by axial movement of the plunger 30 along the waveguide 12 by means of a threaded shaft 31 and an adjusting nut 32. The adjusting nut 32 is confined from moving axially by an end plate 33 which is connected by suitable means to the idler cavity end of the waveguide 12. To minimize R.-F. leakage passed the plunger 30, finger stock 34 is soldered to the plunger 30 so that it makes sliding contact with the broad walls of the rectangular waveguide 12.

An idler signal is coupled to or from the idler cavity 11 through an iris 35 and a rectangular waveguide 36 which is soldered to the waveguide 12. A pair of capacitive tuning screws 37 and 38 match the characteristic impedance of the waveguide 36 to the idler cavity 11.

The coaxial signal arm 16 comprises a coaxial connector 40 connected at one end to the capacitive iris 13 through a low-pass filter 41. Directly opposite the coaxial signal arm 16 is a support arm 42 comprising an open circuited coaxial connector 43 connected at one end to the capacitive iris 13 through a low-pass filter 44. The cut-off frequency of the filters 41 and 44 is chosen to be below the cut-off frequency of the waveguide 12 but above the input signal frequency which would be coupled to the signal arm 16. The filters therefore reflect substantially a short-circuit at the pump and idler signal frequencies, thereby effectively grounding the sides of the capacitive iris to the narrow walls of the rectangular waveguide 12. Since both the filters 41 and 44 appear as a high impedance at the signal frequency, input signals are readily coupled from the connector 40 to the varactor diode 14 through the iris 13. Thus, the coaxal signal arm 16 and the support arm 42 serve to support the iris 13 and to effectively ground it at the pump and idler signal frequencies while the signal arm 16 additionally serves to couple an input signal to the varactor diode 14.

The coaxial tuning stub 15 comprises an inner conductor 50, an outer conductor 51 and a sliding short 52. The sliding short 52 is coupled to an external sleeve 53 by screws 54 which pass through slots 55 in the side of the outer conductor 51. The tuning stub 15 is tuned to resonate the varactor diode at approximately the idler and pump signal frequencies and may then be locked in place with a locking screw 56.

In one preferred embodiment, the device is used as a sum-mode up-converter. The pump and idler cavities 10 and 11 respectively are constructed of type WR–229 waveguide. A pump signal of 4000 megacycles at a level of 100 milliwatts is coupled to the pump cavity 10 through the coaxial input connector 19. An input signal having a centre frequency of 70 megacycles and a level of one milliwatt is coupled to the coaxial connector 40 of the signal arm 16. The pump and input signals produce an idler signal of 4070 megacycles at a level of about 5 milliwatts, which is coupled from the idler cavity 11 through the iris 35 to a suitable idler load (not shown) The pump cavity 10 is tuned to the pump frequency and the idler cavity 11 is tuned to the idler frequency. The varactor diode 14 is then series resonated at approximately the pump and idler frequencies by the coaxial tuning stub 15. Due to its length, the tuning stub 15 appears as virtually a short circuit at 70 megacycles and hence is effectively out of the circuit at the signal frequency. To maintain the response within 0.1 db over 20 megacycles, no reactive tuning of the signal arm 16 is used. However, if optimum gain and/or noise figure is desired, as is the case when the device is used as a low-noise parametric amplifier, signal tuning can be readily provided by placing a coaxial tuning stub in shunt with the signal arm 16, or by connecting such a stub directly across the coaxial connector 43 of the support arm 42. Since both these arms 16 and 42 are effectively grounded at the pump and idler frequencies, tuning the arms 16 or 42 at the signal frequency will not appreciably affect the tuning of the diode 14 at the pump and idler signal frequencies. Because the capacitive iris 13 is D.-C. isolated, a bias voltage may be readily coupled through the signal arm 16 or the support arm 42 to the varactor diode 14. The D.-C. return for the the bias voltage is through the coaxial tuning stub 15.

If the device is to be used as a difference-mode up-converter, the idler cavity 11 is tuned to the difference between the pump frequency and the signal frequency rather than to the sum of the pump and signal frequencies.

As a negative-resistance amplifier, the device may be used as a 1-port amplifier. The input and output signals will both be coupled to the signal arm 16. It will be necessary to utilize a circulator or similar device to separate the input and output signals from each other. The idler cavity 11 is used as the load for the idler signal. Hence, no external load is necessary and the iris 35, waveguide 36, and tuning screws 37 and 38 can be dispensed with.

If the device is used as a down converter, it is desirable that a variable resistance diode be substituted for the varactor diode 14. The idler cavity 11 will then be known as the input signal cavity and the input signal will be coupled to this cavity 11 through the waveguide 36 and the iris 35. A local oscillator signal will be coupled to the cavity 10 through the coaxial connector 19 and the difference frequency signal or output signal will be coupled from the device through the signal arm 16.

In the above described embodiments, the pump and idler signals are coupled to and from the device by loop and iris coupling respectively. Various combinations may be substituted for this arrangement as is well known in the microwave art. In addition, the cavities may be tuned by capacitive tuning screws or by other well-known means rather than by the plungers 17 and 30.

What is claimed is:

1. A non-linear impedance device comprising a waveguide having a capacitive iris located therein; means for coupling a first signal to one end of the waveguide; means for coupling a second signal from the other end of the waveguide; a semiconductor diode located in the same plane as the iris and having one electrode connected to said iris; a tuning element connected to the other electrode of the diode for series tuning the diode; an input signal circuit connected to the iris for coupling a third signal thereto; the third signal frequency being equal to the difference between the first and second signal frequencies, and also being below the cut-off frequency of the waveguide; and means for electrically isolating the iris from the waveguide at the third signal frequency.

2. A device as defined in claim 1 in which the waveguide additionally comprises first and second cavities disposed end to end, the cavities being separated from each other by the capacitive iris, the first signal being coupled to the first cavity and the second signal being coupled from the second cavity.

3. A non-linear impedance device comprising: a waveguide having a capacitive iris located therein; means for coupling a first signal to one end of the waveguide; means for coupling a second signal to the other end of the waveguide; a semiconductor diode located in the same plane as the iris and having one electrode connected to said iris; a tuning element connected to the other electrode of the diode for series tuning the diode; an output signal circuit connected to the iris for coupling a third signal from the device; the third signal frequency being equal to the difference between the first and second signal frequencies, and also being below the cut-off frequency of the waveguide; and means for electrically isolating the iris from the waveguide at the third signal frequency.

4. A device as defined in claim 3 in which the waveguide additionally comprises first and second cavities disposed end to end, the cavities being separated from each other by the capacitive iris, the first signal being coupled to the first cavity and the second signal being coupled to the second cavity.

5. A parametric amplifier comprising a waveguide having a pump cavity and an idler cavity disposed end to end, said cavities being separated from each other by a capacitive iris; means for coupling a pump signal to the pump cavity; a varactor diode located in the same plane as the iris and having one electrode connected to said iris; a tuning element connected to the other electrode of the diode for series tuning the diode; a signal circuit connected to the iris for coupling an input signal to and from the amplifier; the input signal being below the cut-off frequency of the waveguide and mixing with the pump signal in said varactor diode to produce an idler signal which is coupled to the idler cavity; and means for electrically isolating the iris from the waveguide at the input signal frequency.

6. A parametric device comprising a waveguide having a pump cavity and an idler cavity disposed end to end, said cavities being separated from each other by a capacitive iris; means for coupling a pump signal to the pump cavity; means for coupling an idler signal from the idler cavity; a varactor diode located in the same plane as the iris and having one electrode connected to said iris; a tuning element connected to the other electrode of the diode for series tuning the diode; an input signal circuit connected to the iris for coupling an input signal to the diode; the input signal frequency being equal to the difference between the pump and idler signal frequencies, and also being below the cut-off frequency of the waveguide; and means for electrically isolating the iris from the waveguide at the input signal frequency.

7. A device as defined in claim 6 in which the waveguide is rectangular and in which the tuning element is a coaxial tuning stub having inner and outer conductors, the inner conductor being connected to said other electrode of the diode, and the outer conductor being connected to a broad wall of the waveguide.

8. A device as defined in claim 7 in which the means for electrically isolating the iris from the waveguide at the input signal frequency comprises a pair of coaxial low-pass filters each having a cut-off frequency between the input signal frequency and the cut-off frequency of the waveguide, each filter also having a centre conductor connected at one end to the iris; one of the filters forming part of the input signal circuit and being connected in series therewith and the other filter being open circuited at the other end thereof.

References Cited by the Examiner

UNITED STATES PATENTS 3,212,018 10/1965 Amoss et al. ---------- 330—4.9

OTHER REFERENCES

Pettai et al.: "Proceedings of the IRE," July 1960, pp. 1323–1324.

ROY LAKE, *Primary Examiner.*

D. R. HOSTETTER, N. KAUFMAN, *Assistant Examiners.*